(12) United States Patent
Romani et al.

(10) Patent No.: US 9,151,806 B2
(45) Date of Patent: *Oct. 6, 2015

(54) READING CIRCUIT FOR A MAGNETIC FIELD SENSOR WITH SENSITIVITY CALIBRATION, AND RELATED READING METHOD

(71) Applicant: STMicroelectronics S.r.l., Agrate Brianza (IT)

(72) Inventors: Carlo Alberto Romani, Cornaredo (IT); Enrico Pozzati, Cava Manara (IT); Fabio Bottinelli, Malnate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 14/663,092

(22) Filed: Mar. 19, 2015

(65) Prior Publication Data
US 2015/0192644 A1   Jul. 9, 2015

Related U.S. Application Data

(63) Continuation of application No. 13/302,953, filed on Nov. 22, 2011, now Pat. No. 9,013,175.

(30) Foreign Application Priority Data

Nov. 26, 2010  (IT) .............................. TO2010A0942
Nov. 26, 2010  (IT) .............................. TO2010A0943

(51) Int. Cl.
*G01R 35/00*   (2006.01)
*G01R 33/00*   (2006.01)
(Continued)

(52) U.S. Cl.
CPC ........ *G01R 33/0023* (2013.01); *G01R 33/0035* (2013.01); *G01R 33/06* (2013.01); *G01R 33/096* (2013.01); *G01R 33/0017* (2013.01); *G01R 35/00* (2013.01)

(58) Field of Classification Search
CPC .... G01R 33/07; G01R 35/00; G01R 33/0017; G01R 33/06
USPC ............................ 324/202, 252, 228, 207.21
See application file for complete search history.

(56) References Cited

U.S. PATENT DOCUMENTS 4,706,138 A   11/1987  Jove et al.
4,847,584 A   7/1989   Pant
(Continued)

FOREIGN PATENT DOCUMENTS

CN   1695066 A   11/2005
CN   1789920 A   6/2006
(Continued)

*Primary Examiner* — Reena Aurora
(74) *Attorney, Agent, or Firm* — Seed IP Law Group PLLC

(57) ABSTRACT

A reading circuit for a magnetic-field sensor, generating an electrical detection quantity as a function of a detected magnetic field and of a detection sensitivity, is provided with an amplification stage, which is coupled to the magnetic-field sensor and generates an output signal as a function of the electrical detection quantity and of an amplification gain. In particular, the amplification gain is electronically selectable, and the reading circuit is moreover provided with a calibration stage, integrated with the amplification stage and configured so as to vary a value of the amplification gain in such a way as to compensate a variation of the detection sensitivity with respect to a nominal sensitivity value.

19 Claims, 3 Drawing Sheets

(51) Int. Cl.
*G01R 33/06* (2006.01)
*G01R 33/09* (2006.01)

(56) References Cited

U.S. PATENT DOCUMENTS

| | | |
|---|---|---|
| 5,247,278 A | 9/1993 | Pant et al. |
| 6,566,856 B2 | 5/2003 | Sandquist et al. |
| 7,053,607 B2 | 5/2006 | Sato |
| 7,746,065 B2 * | 6/2010 | Pastre et al. .......... 324/202 |
| 9,013,175 B2 * | 4/2015 | Romani et al. ........ 324/202 |
| 2008/0054897 A1 | 3/2008 | Crolly et al. |
| 2009/0212771 A1 | 8/2009 | Cummings et al. |
| 2009/0224716 A1 | 9/2009 | Vig et al. |
| 2010/0166122 A1 | 7/2010 | Pahuja et al. |
| 2012/0086438 A1 | 4/2012 | Tu |
| 2012/0153936 A1 | 6/2012 | Romani et al. |
| 2012/0158324 A1 | 6/2012 | Romani et al. |
| 2012/0166122 A1 | 6/2012 | Bottinelli et al. |

FOREIGN PATENT DOCUMENTS

| | | |
|---|---|---|
| CN | 1890576 A | 1/2007 |
| CN | 202748469 U | 2/2013 |
| WO | 2005/054887 A1 | 6/2015 |

* cited by examiner

READING CIRCUIT FOR A MAGNETIC FIELD SENSOR WITH SENSITIVITY CALIBRATION, AND RELATED READING METHOD

BACKGROUND

1. Technical Field

The present disclosure relates to a reading circuit for a magnetic-field sensor, for example an anisotropic magnetoresistive (AMR) magnetic sensor, with calibration of the sensitivity of the sensor, and to a corresponding calibration method.

2. Description of the Related Art

Magnetic-field sensors, in particular AMR magnetic sensors, are used in a plurality of applications and systems, for example in compasses, in systems for detecting ferrous materials, in the detection of currents, and in a wide range of other applications, thanks to their capacity of detecting natural magnetic fields (for example, the Earth's magnetic field) and magnetic fields generated by electrical components (such as electrical or electronic devices and lines traversed by electric current).

As it is known, the phenomenon of anisotropic magnetoresistivity occurs within particular ferrous materials, which, when subjected to an external magnetic field, undergo a variation of resistivity as a function of the characteristics of the external magnetic field. Usually, these materials are applied in the form of thin strips so as to form resistive elements, and the resistive elements thus formed are electrically connected to form a bridge structure (typically a Wheatstone bridge).

It is moreover known to manufacture AMR magnetic sensors with standard semiconductor micromachining techniques, as described, for example, in U.S. Pat. No. 4,847,584. In particular, each magnetoresistive element can be formed by a film of magnetoresistive material, such as for example permalloy (i.e., a ferromagnetic alloy containing iron and nickel), deposited to form a thin strip on a substrate made of semiconductor material, for example silicon.

When an electric current is made to flow through a magnetoresistive element, the angle $\theta$ between the direction of magnetization of the same magnetoresistive element and the direction of the current flow affect the effective value of resistivity of the magnetoresistive element so that, as the value of the angle $\theta$ varies, the value of electrical resistance varies (in detail, the variation follows a law of the $\cos^2\theta$ type). For example, a direction of magnetization parallel to the direction of the current flow results in a maximum resistance value to the passage of current through the magnetoresistive element, whereas a direction of magnetization orthogonal to the direction of the current flow results in a minimum resistance value to the passage of current through the magnetoresistive element.

Usually, AMR magnetic sensors moreover include coils, integrated in the sensors, the so-called "offset straps", which are designed to generate, when traversed by a current of an appropriate value, a magnetic field that couples in the direction of detection of the sensors; in this regard, see for example U.S. Pat. No. 5,247,278. These offset straps are normally used for operations of compensation of the offsets present in the sensors (on account of mismatches in the values of the corresponding electrical components) and self-test operations. In particular, the value of the electrical quantities at output from the sensors are in this case a function both of the external magnetic field to be detected and of the magnetic field generated internally as a result of the current circulating in the offset straps (which is indeed detected by the magnetoresistive elements). The offset straps are constituted by turns of conductive material, for example metal, which are arranged on the same substrate on which the magnetoresistive elements of the sensor are provided, being electrically insulated from, and set in the proximity of, the same magnetoresistive elements.

In particular, the Wheatstone-bridge detection structure of an AMR magnetic sensor includes magnetoresistive elements having ideally the same resistance value, and such as to form diagonal pairs of equal elements, which react in an opposite way with respect to one another to the external magnetic fields, as shown schematically in FIG. 1 (where I is the electric current flowing in the magnetoresistive elements and R the common resistance value).

If a supply voltage $V_s$ is applied at the input of the bridge detection structure (in particular to first two terminals of the bridge, operating as input terminals), in the presence of an external magnetic field $H_e$, a variation of resistance $\Delta R$ of the magnetoresistive elements and a corresponding variation of the voltage drop value on the same magnetoresistive elements occur. In fact, the external magnetic field $H_e$ determines a variation of the direction of magnetization of the magnetoresistive elements. This results in an unbalancing of the bridge, which takes the form of a voltage variation $\Delta V$ at output from the bridge circuit (in particular between the remaining two terminals of the bridge, operating as output terminals). Since the direction of the initial magnetization of the magnetoresistive elements is known beforehand, as a function of the voltage variation $\Delta V$ it is thus possible to determine the component of the external magnetic field acting in the direction of sensitivity of the magnetic sensor (it is thus possible, using three magnetic sensors with directions of sensitivity orthogonal to one another, to determine the modulus and direction of the external magnetic field).

In particular, in order to detect unbalancing of the Wheatstone bridge and generate an output signal indicating the characteristics of the external magnetic field to be measured, a reading circuit (or front-end) is normally used, which is coupled to the output of the AMR magnetic sensor, and includes, for example, an instrumentation amplifier. The AMR magnetic sensor and the associated reading circuit together form a magnetic-field sensor device, which supplies at output an electrical signal as a function of the detected magnetic field, and has a given input/output response, due in part to the sensitivity of the bridge detection structure, and in part to the gain of the associated reading front-end.

In a known way, the sensitivity of AMR magnetic sensors, i.e., the magnitude of the electrical response supplied by the corresponding bridge detection structure as a function of the external magnetic field to be detected, normally has a high variability (or spread), which can even reach 40% with respect to the nominal value. This spread is due, for example, to the intrinsic process variations associated to the manufacturing of the sensors.

Consequently, a same external magnetic field can generate electrical signals the value of which can vary considerably even between sensors belonging to one and the same production lot. Such a spread in the sensitivity of AMR magnetic sensors is not desirable, in particular in those applications that require an accurate measurement of the magnetic field to be detected, such as, for example, in magnetometers.

Therefore, techniques for calibration of AMR magnetic sensors have been proposed, designed to reduce or at least limit the spread of the sensitivity of the corresponding detection structures.

For example, a calibration technique envisages the use of processes of "laser trimming" during the manufacturing process of the AMR magnetic sensors, i.e., the use of techniques of laser removal for adjusting the values of the electronic components that constitute the sensors. In particular, within an external environment with controlled magnetic field, the electrical characteristics of the sensor are physically adjusted in such a way that it will supply at output an electrical quantity having a value corresponding to that of the external magnetic field, irrespective of the process variations that might have altered the sensitivity thereof.

This technique, however, in addition to being complex and costly to implement (in so far as it requires costly testing and calibration equipment), requires an accurate control of the magnetic field present in the area surrounding the sensors during the calibration operations. This accurate control may, however, prove difficult to achieve on account, for example, of parasitic magnetic fields generated by the testing machinery or coming from the manufacturing environment.

The techniques of calibration of AMR magnetic sensors that have so far been proposed are hence not altogether satisfactory, and frequently are unable to ensure the desired results.

BRIEF SUMMARY

An embodiment provides a technique for calibrating the sensitivity of an AMR magnetic sensor, being free from the disadvantages of the known art, highlighted previously.

In an embodiment, a reading circuit for a magnetic-field sensor, said magnetic-field sensor being designed to generate an electrical detection quantity as a function of a detected magnetic field and of a detection sensitivity, comprises an amplification stage, coupled to said magnetic-field sensor and configured to generate an output signal as a function of said electrical detection quantity and of an amplification gain, wherein said amplification gain is electronically selectable, and by comprising a calibration stage, integrated with said amplification stage and configured to vary a value of said amplification gain so as to compensate for a variation of said detection sensitivity with respect to a nominal sensitivity value. In an embodiment, said calibration stage is configured to: detect at least one value associated to said output signal upon detection, by said magnetic-field sensor, of a controlled magnetic field, of a known value; determining an effective value of said detection sensitivity, as the result of said variation of sensitivity, as a function of said value associated to said output signal; and varying the value of said amplification gain based on said effective value of said detection sensitivity. In an embodiment, said magnetic-field sensor is provided with at least one first magnetoresistive element and with a magnetization element operatively coupled to said at least one first magnetoresistive element; and wherein said calibration stage is configured so as to cause generation of said controlled magnetic field as the result of an excitation current sent through said magnetization element. In an embodiment, said calibration stage is configured to: acquire at least a first value of said output signal, in the presence of an external magnetic field and in the absence of said controlled magnetic field; acquire at least a second value of said output signal, in the presence both of said external magnetic field and of said controlled magnetic field; and jointly process said first and second values of said output signal in order to determine said effective value of said detection sensitivity. In an embodiment, said calibration stage is configured to determine a difference between said first value and said second value of said output signal in order to determine said effective value of said detection sensitivity as a function of the value of said controlled magnetic field, irrespective of the value of said external magnetic field. In an embodiment, said amplification stage comprises an amplifier unit, having at least one input designed to receive said electrical detection quantity and at least one output designed to supply said output signal; and wherein said calibration stage comprises a gain-variation unit, coupled to said amplifier unit and configured to vary a gain thereof between the input and the output. In an embodiment, said amplifier unit comprises a gain network, coupled to said at least one input and to said at least one output, and said gain-variation unit comprises an adjustable-impedance unit, which is coupled to said gain network and has a selectable impedance value; and wherein said calibration stage is configured to provide a gain-control signal to said gain-variation unit for selecting the value of said impedance. In an embodiment, said magnetic-field sensor is an AMR magnetic sensor provided with further magnetoresistive elements, arranged with said at least one first magnetoresistive element to form a bridge detection structure; wherein said electrical detection quantity is a unbalancing signal of said bridge detection structure. In an embodiment, an electronic device comprises a magnetic-field sensor, and a reading circuit, coupled to said magnetic-field sensor, said electronic device further comprising a control unit, coupled to said reading circuit for receiving said output signal. In an embodiment, said reading circuit is made as an ASIC (application-specific integrated circuit), and is housed in a same package together with a die integrating said magnetic-field sensor.

In an embodiment, a method for reading a magnetic-field sensor, said magnetic-field sensor being designed to generate an electrical detection quantity as a function of a detected magnetic field and of a detection sensitivity, comprises the step of generating, by means of a reading circuit, coupled to said magnetic-field sensor and having an amplification gain, an output signal as a function of said electrical detection quantity and of said amplification gain, and varying a value of said amplification gain so as to compensate for a variation of said detection sensitivity with respect to a nominal sensitivity value. In an embodiment, said varying comprises: detecting at least one value associated to said output signal upon detection, by said magnetic-field sensor, of a controlled magnetic field, of a known value; determining an effective value of said detection sensitivity, as the result of said variation of sensitivity, as a function of said value associated to said output signal; varying the value of said amplification gain based on said effective value of said detection sensitivity. In an embodiment, said magnetic-field sensor is provided with at least one first magnetoresistive element and with a magnetization element operatively coupled to said at least one first magnetoresistive element; and wherein said step of detecting at least one value comprises: acquiring at least a first value of said output signal, in the presence of an external magnetic field and in the absence of said controlled magnetic field; acquiring at least a second value of said output signal, in the presence both of said external magnetic field and of said controlled magnetic field; and jointly processing said first value and said second value of said output signal in order to determine said effective value of said detection sensitivity. In an embodiment, jointly processing comprises: computing a difference between said first value and said second value of said output signal in order to determine said effective value of said sensitivity, as a function of the value of said controlled magnetic field irrespective of the value of said external magnetic field. In an embodiment, said reading circuit is made as a ASIC (Application Specific Integrated Circuit), and is housed in a same package together with a die integrating said magnetic-field sensor.

In an embodiment, a reading circuit comprises: an amplification stage configured to receive a magnetic field detection signal of a magnetic field sensor and to generate an output signal as a function of the magnetic field detection signal and of an amplification gain of the amplification stage; and a calibration stage configured to control the amplification gain of the amplification stage based on an indication of a detection sensitivity of the magnetic field sensor. In an embodiment, said calibration stage is configured to: measure a value of the output signal associated with a controlled magnetic field having a known value; determine an effective value of said detection sensitivity as a function of said measured value; and control the amplification gain based on said effective value of said detection sensitivity. In an embodiment, said calibration stage is configured to generate an excitation current to excite a magnetization element of the magnetic field sensor and the amplification stage is configured to electrically couple to a first magnetoresistive element of the magnetic field sensor. In an embodiment, said calibration stage is configured to: measure at least a first value of said output signal, in the presence of an external magnetic field and in the absence of a controlled magnetic field; measure at least a second value of said output signal, in the presence both of said external magnetic field and of said controlled magnetic field; determine an effective value of said detection sensitivity as a function of said first and second measured values; and control the amplification gain based on said effective value of said detection sensitivity. In an embodiment, said calibration stage is configured to determine a difference between said first measured value and said second measured value of said output signal. In an embodiment, said amplification stage comprises an amplifier, having at least one input configured to receive said magnetic field detection signal and at least one output configured to supply said output signal; and wherein said calibration stage comprises a gain-variation unit, coupled to said amplifier and configured to vary a gain of the amplifier between the at least one input and the at least one output of the amplifier. In an embodiment, said amplifier comprises a gain network, coupled to said at least one input and to said at least one output, and said gain-variation unit comprises an adjustable-impedance unit coupled to said gain network and having a selectable impedance value, wherein said calibration stage is configured to provide a gain-control signal to said gain-variation unit for selecting a value of said selectable impedance. In an embodiment, the magnetic field sensor is an anisotropic magnetoresistive (AMR) magnetic sensor, the amplification stage is configured to electrically couple to a bridge detection structure formed from a plurality of magnetoresistive elements of the magnetic field sensor, and said magnetic detection signal is an unbalancing signal of said bridge detection structure.

In an embodiment, a system comprises: a magnetic-field sensor configured to generate a magnetic field detection signal as a function of one or more magnetic fields; and a reading circuit having: an amplification stage coupled to the magnetic-field sensor and configured to generate an output signal as a function of the magnetic field detection signal and of an amplification gain of the amplification stage; and a calibration stage configured to control the amplification gain of the amplification stage based on an indication of a detection sensitivity of the magnetic field sensor. In an embodiment, the system further comprises a control unit, coupled to said reading circuit and configured to receive said output signal. In an embodiment, said reading circuit is an application-specific integrated circuit housed in a same package together with a die comprising said magnetic-field sensor. In an embodiment, said calibration stage is configured to: measure a value of the output signal associated with a controlled magnetic field having a known value; determine an effective value of said detection sensitivity as a function of said measured value; and control the amplification gain based on said effective value of said detection sensitivity. In an embodiment, said calibration stage is configured to generate an excitation current to excite a magnetization element of the magnetic field sensor and the amplification stage is configured to electrically couple to a first magnetoresistive element of the magnetic field sensor. In an embodiment, wherein said calibration stage is configured to: measure at least a first value of said output signal, in the presence of an external magnetic field and in the absence of a controlled magnetic field; measure at least a second value of said output signal, in the presence both of said external magnetic field and of said controlled magnetic field; determine an effective value of said detection sensitivity as a function of said first and second measured values; and control the amplification gain based on said effective value of said detection sensitivity. In an embodiment, said calibration stage is configured to determine a difference between said first measured value and said second measured value of said output signal.

In an embodiment, a method comprises: receiving a signal of a magnetic-field sensor, the received signal being a function of a detected magnetic field and of a detection sensitivity of the magnetic-field sensor; controlling an amplification gain of a reading circuit to compensate for a variation of said detection sensitivity from a nominal detection sensitivity value; and generating an output of the reading circuit as a function of said received signal and of said amplification gain. In an embodiment, said controlling the amplification gain comprises: measuring a value of the output signal associated with a controlled magnetic field having a known value; determining an effective value of said detection sensitivity as a function of said measured value; and controlling the amplification gain based on said effective value of said detection sensitivity. In an embodiment, said measuring a value of the output signal associated with a controlled magnetic field comprises generating an excitation current to excite a magnetization element of the magnetic field sensor. In an embodiment, said controlling the amplification gain comprises: measuring at least a first value of said output signal, in the presence of an external magnetic field and in the absence of a controlled magnetic field; measuring at least a second value of said output signal, in the presence both of said external magnetic field and of said controlled magnetic field; determining an effective value of said detection sensitivity as a function of said first and second measured values; and controlling the amplification gain based on said effective value of said detection sensitivity. In an embodiment, said determining said effective value comprises determining a difference between said first measured value and said second measured value of said output signal.

In an embodiment, a system comprises: means for generating a magnetic field detection signal as a function of one or more magnetic fields; means for generating an output signal as a function of the magnetic field detection signal and an amplification gain; and means for controlling the amplification gain based on an indication of a detection sensitivity of the means for generating the magnetic field detection signal. In an embodiment, the system comprises an application-specific integrated circuit including the means for generating the output signal and the means for controlling the amplication gain in a same package together with a die comprising said means for generating the magnetic field detection signal. In an embodiment, said means for controlling the amplification gain is configured to: measure at least a first value of said output signal, in the presence of an external magnetic field and in the absence of a controlled magnetic field; measure at least a second value of said output signal, in the presence both of said external magnetic field and of said controlled magnetic field; determine an effective value of said detection sensitivity as a function of said first and second measured values; and control the amplification gain based on said effective value of said detection sensitivity. In an embodiment, said means for controlling the amplification gain is configured to determine a difference between said first measured value and said second measured value of said output signal.

BRIEF DESCRIPTION OF THE SEVERAL VIEWS OF THE DRAWINGS

For a better understanding of this disclosure, embodiments thereof are now described, purely by way of non-limiting example, with reference to the attached drawings, wherein.

DETAILED DESCRIPTION

Figure 1:
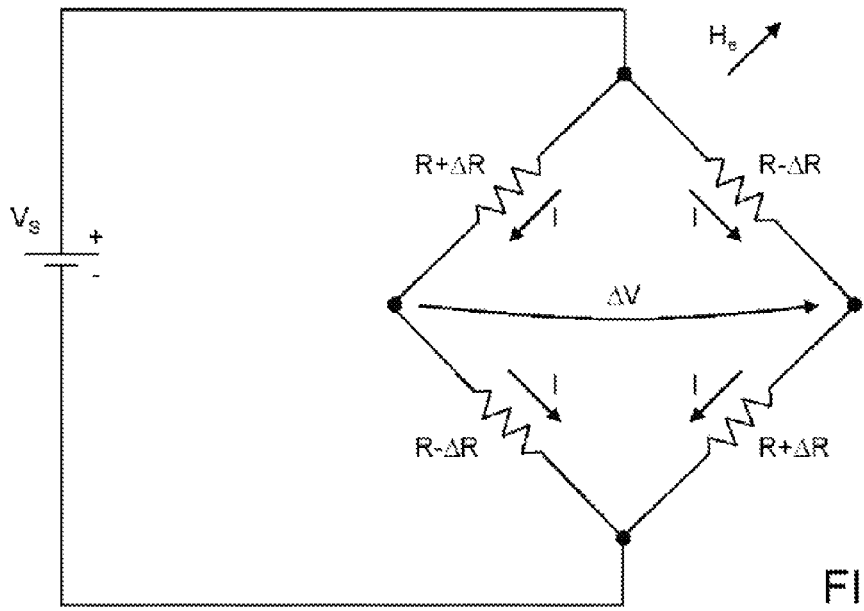
FIG. 1 shows a simplified electrical diagram of an AMR magnetic sensor of a known type, with a Wheatstone-bridge detection structure.

In the following description, certain details are set forth in order to provide a thorough understanding of various embodiments of devices, methods and articles. However, one of skill in the art will understand that other embodiments may be practiced without these details. In other instances, well-known structures and methods associated with, for example, magnetic sensors, amplifiers, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to."

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure or the claims.

The sizes and relative positions of elements in the drawings are not necessarily drawn to scale. For example, the shapes of various elements and angles are not drawn to scale, and some of these elements may be enlarged and positioned to improve drawing legibility. Further, the particular shapes of the elements as drawn are not necessarily intended to convey any information regarding the actual shape of particular elements, and have been selected solely for ease of recognition in the drawings. Geometric references are not intended to refer to ideal embodiments. For example, a reference to square-shaped does not mean that an element has a geometrically perfect square shape.

An embodiment applies to a magnetic-field sensor, for example, an AMR magnetic sensor of the type described with reference to FIG. 1, and envisages implementation of a reading circuit, associated to the magnetic-field sensor, which comprises: a variable and selectable gain stage; and a calibration stage, configured for varying the gain value implemented by the gain stage in such a way as to compensate, and in particular reduce, spread of sensitivity of the magnetic-field sensor due, for example, to the manufacturing process of the same magnetic-field sensor. In other words, the reading circuit associated to the magnetic-field sensor is provided with a function of calibration of the sensitivity of the sensor in such a way that the user will perceive an overall response of the sensor device (understood as the assembly of the sensor and of the corresponding reading circuit) that corresponds to a nominal or expected response (i.e., a data sheet response).

An embodiment envisages use, for the aforesaid operation of calibration, of an offset coil (the so-called "offset strap") integrated in the structure of the AMR magnetic sensor (see the foregoing description) in order to generate an internal magnetic field of a known and controlled value, in the proximity of the magnetoresistive elements of the magnetic-field sensor. The response of the sensor device to this magnetic field of a controlled value can in fact be used for determining the spread of the effective sensitivity of the magnetic-field sensor and vary the gain of the associated reading circuit accordingly.

Figure 2:
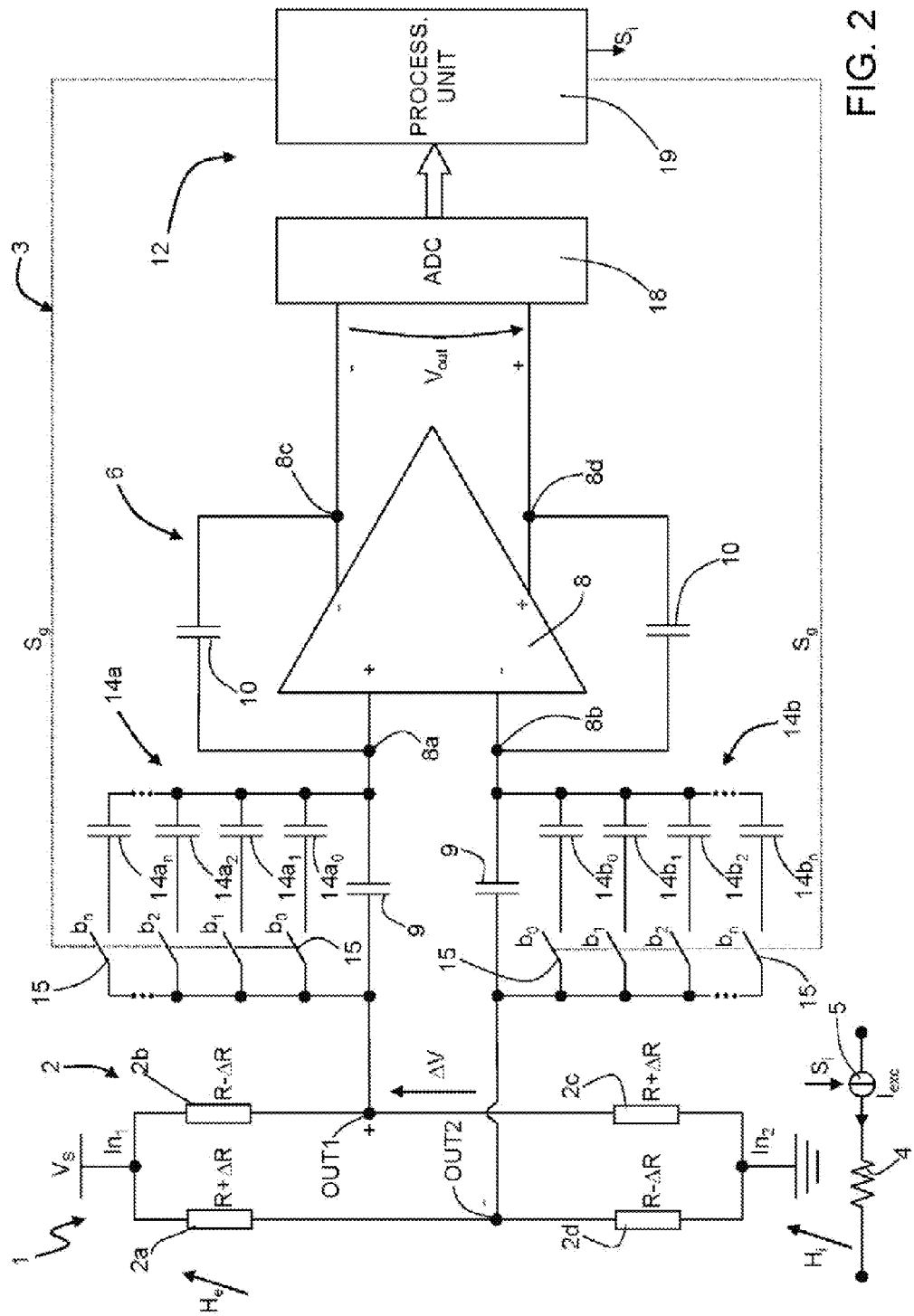
FIG. 2 shows a simplified diagram of a reading circuit for a magnetic-field sensor, in particular an AMR magnetic sensor, including a calibration stage according to one embodiment.

In detail, FIG. 2 is a schematic illustration of a sensor device according to one embodiment, designated as a whole by 1, including a magnetic-field sensor (in particular an AMR magnetic sensor), designated by 2 and represented schematically by means of its Wheatstone-bridge equivalent circuit, and a reading circuit (or front-end) 3, associated to the magnetic-field sensor 2.

In particular, the magnetic-field sensor 2 comprises a Wheatstone-bridge detection structure, with four magnetoresistive elements $2a$-$2d$, for example, constituted by strips of a thin film of magnetoresistive material, such as permalloy, having a same resistance value at rest R (in the absence of external magnetic fields) and designed to undergo in pairs one and the same variation $\Delta R$ in the presence of an external magnetic field $H_e$ (the pairs are formed by the diagonally facing elements in the bridge; namely, a first pair is formed by the magnetoresistive elements $2a$ and $2c$, and a second pair by the magnetoresistive elements $2b$ and $2d$).

The Wheatstone-bridge detection structure has a first input terminal $In_1$, connected to the positive pole of a supply source, which supplies a supply voltage $V_s$, and a second input terminal $In_2$, connected to the negative pole of the same supply source (for example, coinciding with a ground terminal of the reading circuit 3). The Wheatstone-bridge detection structure moreover has a first output terminal $Out_1$ and a second output terminal $Out_2$, present across which is the electrical unbalancing signal (i.e., the voltage variation $\Delta V$), which is a function, in particular, of the characteristics of the external magnetic field $H_e$.

The magnetic-field sensor 2 further comprises an offset coil 4 (represented schematically in FIG. 2 as a resistor, and commonly known as "offset strap"), arranged so as to be magnetically coupled to the magnetoresistive elements $2a$-$2d$ and electrically connected to a current generator 5, designed to supply an excitation current $I_{exc}$, of a controlled value, to the same offset strap 4. In a known way, and as has been discussed above, the offset strap 4 is integrated in the magnetic-field sensor 2 (for example, being provided on the same silicon substrate so that on which the magnetoresistive elements 2a-2d are provided) and is designed to generate, as a function of the value of the excitation current $I_{exc}$, an internal magnetic field $H_i$, of a known value.

The reading circuit 3 comprises an amplification stage 6 (shown schematically in FIG. 2), which is electrically coupled to the output of the magnetic-field sensor 2 and includes, for example, an operational amplifier, designated by 8, of a fully differential type (i.e., having differential inputs and outputs). The amplifier 8 has a non-inverting input 8a connected to the first output terminal $Out_1$ of the magnetic-field sensor 2, and an inverting input 8b connected to the second output terminal $Out_2$. The amplifier 8 moreover has an inverting output 8c and a non-inverting output 8d, present across which is an output signal Vout, which is a function of the voltage variation $\Delta V$ supplied by the magnetic-field sensor 2.

The amplification stage 6 comprises a first circuit branch and a second circuit branch, which are substantially the same, are connected respectively to the non-inverting and inverting inputs 8a, 8b of the amplifier 8, and each of which provides a gain network, in this case of the capacitive type (evidently, in a different embodiment, a resistive gain network may be provided).

As illustrated, each branch comprises a first gain capacitor 9, having a first terminal connected to a respective output terminal $Out_1$, $Out_2$ (according to the circuit branch considered) of the magnetic-field sensor 2, and a second terminal connected to a respective non-inverting 8a or inverting 8b input (once again, according to the circuit branch considered) of the amplifier 8. The first gain capacitor 9 has a capacitance $C_1$. Each circuit branch further comprises a second gain capacitor 10, having a first terminal connected to a respective non-inverting 8a or inverting 8b input (according to the circuit branch considered) of the amplifier 8, and a second terminal connected to a respective inverting 8c or non-inverting 8d output (once again, according to the circuit branch considered) of the amplifier 8. The second gain capacitor 10 has a capacitance $C_2$.

The reading circuit 3 further comprises a calibration stage 12, configured so as to implement a calibration algorithm (described in detail hereinafter) for compensating variations of sensitivity of the detection structure of the magnetic-field sensor 2, and in particular for reducing the effects of possible spread, due, for example, to the manufacturing process.

In detail, the calibration stage 12 comprises a first trimmable-capacitor (or "captrim") unit 14a and a second trimmable-capacitor (or "captrim") unit 14b, which are connected in parallel to the first gain capacitor 9 respectively of the first and second circuit branches and act as elements for variation of the gain of the amplification stage 6. Each captrim unit 14a, 14b has: a first terminal and a second terminal, between which an overall capacitance of variable value $C_x$ is present; and a control terminal, on which it receives a gain-control signal $S_g$, which determines the value of the aforesaid overall capacitance; the gain-control signal $S_g$ may be a n-bit digital signal ($b_0$, $b_1$, $b_2$, ... $b_n$), where n is, for example, equal to six. Clearly, in a different embodiment, where a resistive gain network is used, use of a resistor with variable and selectable resistance could be envisaged.

In greater detail, each captrim unit 14a, 14b is made by a respective bank of elementary capacitors $14a_0$-$14a_n$, $14b_0$-$14b_n$, which are selectively connected in parallel to one another, and each of which is connected in series to a respective enabling switch 15, controlled by a respective bit $b_0$-$b_n$ of the gain-control signal $S_g$. In this way, as a function of the bit configuration of the gain-control signal $S_g$, the configuration of the elementary capacitors $14a_0$-$14a_n$, $14b_0$-$14b_n$ connected in parallel varies, and hence the value of the overall capacitance $C_x$ of the captrim units 14a, 14b also varies.

In particular, it is evident that the gain G of the amplification stage 6, which determines the value of the output signal Vout, is given by $$G=-(C_1+C_x)/C_2$$

where the overall capacitance $C_x$ is given by the sum of the capacitances of the elementary capacitors $14a_0$-$14a_n$, $14b_0$-$14b_n$ that are each time connected in parallel in the respective bank of capacitors. The gain G is hence variable, and electronically selectable (so as to be incremented or decremented), as a function of the gain-control signal $S_g$.

The calibration stage 12 further comprises: an analog-to-digital converter (ADC) 18, which has inputs connected to the outputs 8c, 8d of the amplifier 8 and is designed to convert from analog to digital the output signal Vout supplied by the amplifier 8 (the ADC 18 operates with m bits, where m is, for example, equal to twelve); and a processing unit 19 (for example, including a microprocessor or a microcontroller, or a similar computing tool), connected to the output of the ADC 18 and designed to implement, by means of an appropriate control logic, the steps of the calibration algorithm that will be described hereinafter.

In particular, the processing unit 19, as a function of the value of the output signal Vout, determines the value of the gain-control signal $S_g$ to be sent to the first captrim unit 14a and to the second captrim unit 14b, for varying the gain G of the amplification stage 6.

The processing unit 19 also generates a current-control signal $S_i$, which it sends to the current generator 5, for controlling supply of the excitation current $I_{exc}$ to the offset strap 4 integrated in the magnetic-field sensor 2, and in particular for controlling generation, by means of the same offset strap 4, of the internal magnetic field $H_i$ of known and controlled value. In a different embodiment, the current generator 5 can be controlled by a control unit external to the reading circuit 3 (for example, a control unit of the electronic apparatus that incorporates the sensor device 1), and the processing unit 19 receives from this external control unit the information on the value of the internal magnetic field generated, when required, by means of the offset strap 4.

Figure 3:
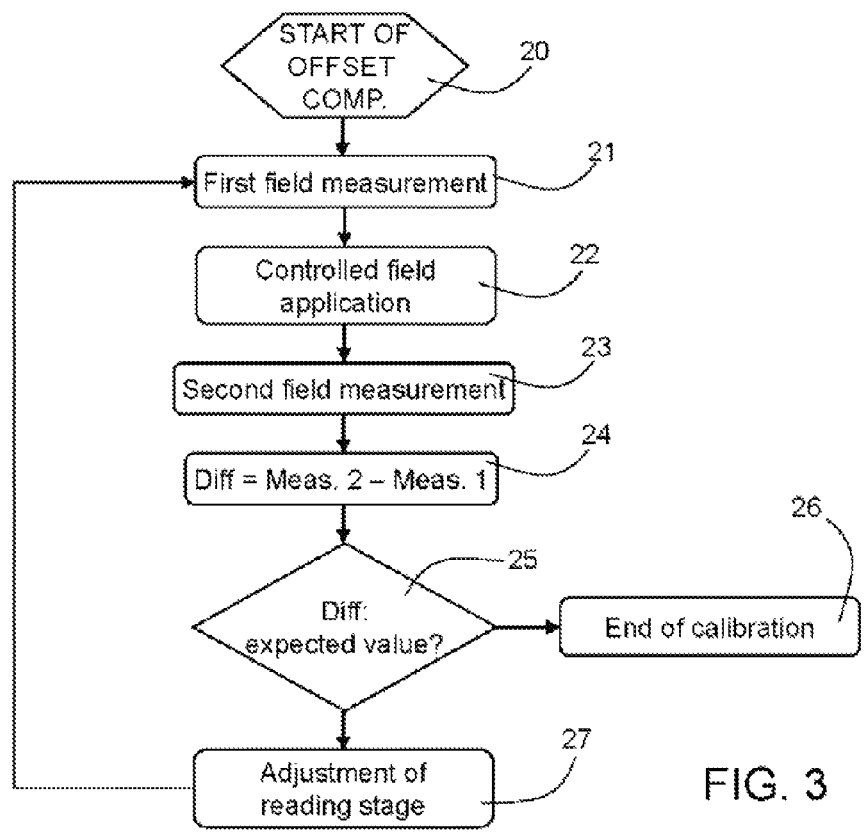
FIG. 3 is a flowchart corresponding to operations envisaged by a calibration method implemented in the circuit of FIG. 2.

As illustrated in FIG. 3, an embodiment of an algorithm for calibration of the magnetic-field sensor 2 envisages the operations described in what follows, which may be carried out within the calibration stage 12, for example by the corresponding processing unit 19.

In an initial step 20, the operations of calibration and compensation of the variations of sensitivity of the magnetic-field sensor 2 begin. Start of these operations may for example occur: at the end of the manufacturing process for the sensor and the corresponding reading electronics; following upon a command imparted by a user; following upon a command received from an external electronic unit; or else following upon turning-on of the electronic apparatus incorporating the sensor device 1 (according to the specific application and/or the user requirements).

Next at step 21, the processing unit 19 issues a command for execution of a first measurement of the output signal Vout supplied by the amplifier 8 coupled to the magnetic-field sensor 2, in the presence of just the external magnetic field $H_e$ (which is due, for example, to the Earth's magnetic field, and the value of which is not known beforehand), i.e., without there being applied any excitation to the offset strap 4 (the internal magnetic field $H_i$ is hence zero).

In this way, a first sample $Vout_1$ of the output signal Vout is acquired, the value of which is given by the following expression:

$$Vout_1 = H_e \cdot S \cdot G$$

where S is the value of sensitivity of the magnetic-field sensor 2, which may possibly differ from a nominal value on account of process spread, and G is the gain of the amplification stage 6, given by the expression given above; namely, $$G = -(C_1 + C_x)/C_2$$

Next at step 22, the internal magnetic field of known and controlled value is generated in the magnetic-field sensor 2 by supplying the excitation current $I_{exc}$ to the offset strap 4 integrated in the sensor.

A second measurement of the output signal Vout is then carried out at step 23, and a second sample $Vout_2$ of the same output signal Vout is acquired. Given that the magnetoresistive elements 2a-2d of the magnetic-field sensor 2 sense in this case both the external magnetic field $H_e$ and the internal magnetic field $H_i$, the second sample $Vout_2$ is given by the following expression:

$$Vout_2 = (H_e + H_i) \cdot S \cdot G$$

The processing unit 19 then computes at step 24 a difference Diff between the first sample $Vout_1$ and the second sample $Vout_2$ acquired previously (this difference may be conveniently carried out digitally):

$$Diff = Vout_2 - Vout_1 = (H_e + H_i) \cdot S \cdot G \cdot H_e \cdot S \cdot G = H_i \cdot S \cdot G$$

The difference Diff is hence a function of just the internal magnetic field $H_i$ and is independent of the value of the external magnetic field $H_e$. Since the value of the internal magnetic field FL is known, it is possible to act on the value of gain G of the amplification stage 6 for compensating possible variations of the sensitivity S of the magnetic-field sensor 2 to obtain an expected value of the difference Diff (i.e., a value that would be obtained with the nominal value of sensitivity S).

In particular, the product S·G defines an overall response of the sensor device 1 (perceived by the user) between the input, in this case constituted by the value of the internal magnetic field $H_i$, and the output, in this case constituted by the value of the difference Diff.

In an embodiment, the method is employed to cause this overall response to have a nominal or expected value, as per design specifications (or at least to depart as little as possible from this nominal value, within a certain tolerance as per specifications). To achieve this purpose, an embodiment acts on the value of gain G of the amplification stage 6 in order to compensate the presence of spread on the sensitivity value S of the magnetic-field sensor 2.

Consequently, in a step 25 the method envisages verifying whether the value of the difference Diff corresponds, or not, to the expected value, i.e., whether correct compensation of the variation of the value of sensitivity S with respect to the nominal value has been achieved. Alternatively, this check may verify that the difference Diff does not depart from the expected value by more than a threshold value (the value of which may depend upon the type of application and the tolerable level of spread on the sensitivity value S).

If it is found that the difference Diff has the expected value (or does not depart from the expected value by more than the threshold), the algorithm goes on to step 26 to the end of the calibration operations. For example, a message can then be issued to the user indicating that the magnetic-field sensor 2 is calibrated, and that, in a subsequent measurement operation (where the generation of the internal magnetic field $H_i$ is again disabled), the value of the output signal Vout will effectively indicate the external magnetic field $H_e$ to be measured.

Instead, the finding that at step 25 the difference Diff does not have the expected value entails modification of the value of the gain G of the amplification stage 6. Consequently, in a step 27 following upon step 25, the processing unit 19 implements a variation of the value of gain G, in particular by varying the gain-control signal $S_g$ sent to the captrim units 14a, 14b (see the foregoing description). In general, the variation of gain G may occur in discrete increment/decrement steps so as to obtain calibration by successive approximations, or else, the new value of gain G may be determined (by means of a function or a tabular relation) as a function of the deviation of the value of the difference Diff from the expected value.

In particular, the effective value of the sensitivity of the magnetic-field sensor 2, designated by $\overline{S}$, can be determined as a function of the current value of gain G implemented in the reading circuit 3, the value of the internal magnetic field $H_i$, and the value of the difference Diff $$\overline{S} = \frac{Diff}{H_i \cdot G}$$

The new value of gain G' may thus be determined as a function of the aforesaid effective value of the sensitivity $\overline{S}$ and of the nominal value of the same sensitivity S (and, for example, of the tolerance that it is desired to obtain with respect to the same nominal value)

$$G' = f(S, \overline{S})$$

Once the new value of gain G' has been determined and the same gain value has been implemented within the amplification stage 6 (by means of an appropriate reconfiguration of the captrim units 14a, 14b), the algorithm hence returns to the initial step (step 21), for execution of a new session of measurement and determination of a new value for the difference Diff, with the new value of gain G' selected.

The algorithm is thus repeated cyclically until correct compensation of the spread on the sensitivity value S, i.e., until the overall response of the sensor device 1 shows the expected or nominal value.

Figure 4:
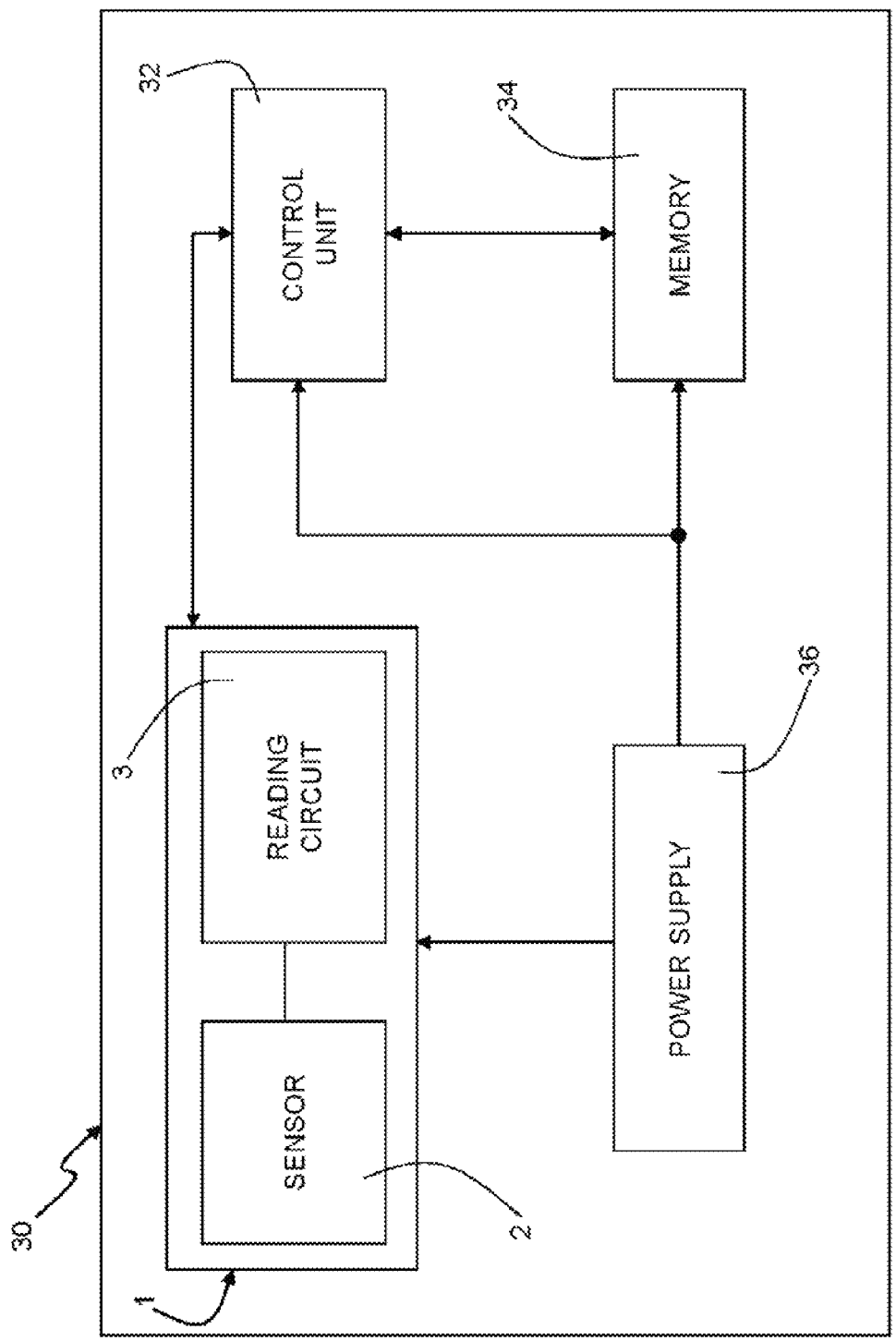
FIG. 4 shows a simplified block diagram of an electronic device including the reading circuit and the magnetic-field sensor of FIG. 2.

FIG. 4 is a schematic illustration of an electronic device 30 in which the magnetic-field sensor 2 and the associated reading circuit 3 find application, for example to provide a magnetometer.

The magnetic-field sensor 2 and the corresponding reading circuit 3 can be made, with semiconductor micromachining techniques, inside respective dice of semiconductor material, for example silicon (the reading circuit 3 being provided as ASIC—Application-Specific Integrated Circuit) and are integrated within a same package (so as to form the sensor device 1 in a single chip).

The electronic device 30 comprises a control unit (a microcontroller or microprocessor, or similar computing and processing tool) 32, connected to the reading circuit 3 of the sensor device 1, in particular for controlling the operations of the reading circuit (such as execution, when desired, of the calibration procedure), and for acquiring and possibly processing further the (analog or digital) output signal Vout supplied at the output from the reading circuit 3, once the gain G of the amplification stage 6 has been calibrated. The electronic device 30 further comprises a memory 34 (optional) and a supply source 36, connected to the sensor device 1, to the magnetic-field sensor 2, to the control unit 32, and to the memory 34, to provide the power supply for their operation; the supply source 36 may comprise, for example, a battery.

In a way not illustrated, the electronic device 30 can comprise further magnetic-field sensors 2 and corresponding reading circuits 3 in order to carry out a detection along a number of measurement axes, for example a set of three cartesian axes x, y, z, to obtain a triaxial system for detection of external magnetic fields. In a known way, three magnetic-field sensors 2 are sufficient to identify three spatial components of an external magnetic field $H_e$, thus uniquely identifying the direction and intensity thereof. In this case, the electronic device 30 may further comprise a position-detection system, for example including an accelerometer, configured for detecting orientation of the electronic device 30 with respect to the Earth's surface.

Various advantages of embodiments of the circuit and of the reading method according to the present description emerge from the foregoing description.

In particular, the presence of the calibration stage 12 in the reading circuit 3 associated to the magnetic-field sensor 2 enables an automatic calibration of the spread of sensitivity of the sensor to be carried out, without any need for interventions from the outside. Calibration is advantageously carried out within the same sensor device 1, or in any case within the electronic device 30 that incorporates the sensor device 1, without there being required any complex external testing equipment. The calibration procedures can be implemented also by the end user, if desired by the applications.

Advantageously, the operations of calibration can be carried out at the level of the ASIC (i.e., in the integrated circuit associated, in the same package, to the magnetic-field sensor 2), without there being required further processing operations by an external electronic unit.

In addition, the use of the offset strap 4, integrated in the magnetic-field sensor 2, enables (by generation of a controlled current) generation of a field of a known value for the operations of calibration, without requiring a controlled external environment in which to perform the same operations (the algorithm described does not require in fact the knowledge of the value of the external magnetic field $H_e$).

In general, the circuit and the method described enable elimination (or at least reduction) of the deviation of the value of the output signal Vout of the sensor device 1 with respect to the expected value, even in the presence of a high spread (for example, equal to 20%) of the sensitivity of the magnetic-field sensor 2.

Finally, it is clear that modifications and variations may be made to what has been described and illustrated herein, without thereby departing from the scope of the present disclosure.

In particular, it is evident that the circuit implementation of the calibration stage 12 may vary with respect to what has been described and illustrated herein; a variable-gain resistive network may, for example, be provided, associated to the amplifier 8; the amplifier 8 may have a single-differential output (i.e., a single output on which the output signal Vout is present). The calibration algorithm may differ from the one described and illustrated; for example, the algorithm may envisage the use of a dichotomic technique (of a type in itself known) for identifying by successive approximations the appropriate value to be assigned to the gain G of the amplification stage 6 for compensating the variation of sensitivity of the magnetic-field sensor 2.

Embodiments of the methods and circuits according to the present disclosure may moreover be used for compensating the offset of further magnetic-field sensors comprising magnetoresistive elements (or in general at least one magnetoresistive element) in a configuration that may even be different from the one described and illustrated.

Some embodiments may take the form of or comprise computer program products. For example, according to one embodiment there is provided a computer readable medium comprising a computer program adapted to perform one or more of the methods or functions described above. The medium may be a non-transitory medium such as a physical storage medium, for example, a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the systems and/or modules may be implemented or provided in other manners, such as at least partially in firmware and/or hardware, including, but not limited to, one or more application-specific integrated circuits (ASICs), digital signal processors, discrete circuitry, logic gates, state machines, standard integrated circuits, controllers (e.g., programmed by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A reading circuit, comprising:
an amplifier having at least one input configured to receive a magnetic field detection signal of a magnetic field sensor and at least one output, and configured to generate an output signal at the at least one output as a function of the magnetic field detection signal and of an amplification gain between the at least one input and the at least one output of the amplifier; and
calibration circuitry configured to generate one or more control signals to control a feedback loop of the amplifier based on an indication of a detection sensitivity of the magnetic field sensor.

2. The circuit according to claim 1 wherein said calibration circuitry is configured to:
determine a value of the output signal associated with a controlled magnetic field having a known value;
calculate an effective value of said detection sensitivity of the magnetic field sensor as a function of said determined value; and
generate the one or more control signals based on said effective value of said detection sensitivity.

3. The circuit according to claim 2 wherein said calibration circuitry is configured to generate an excitation current to excite a magnetization element of the magnetic field sensor and the amplifier is configured to electrically couple to a first magnetoresistive element of the magnetic field sensor.

4. The circuit according to claim 1 wherein said calibration circuitry is configured to:
measure at least a first value of said output signal, in the presence of an external magnetic field and in the absence of a controlled magnetic field;
measure at least a second value of said output signal, in the presence both of said external magnetic field and of said controlled magnetic field;
determine an effective value of said detection sensitivity as a function of said first and second measured values; and
generate the one or more control signals based on said effective value of said detection sensitivity.

5. The circuit according to claim 4 wherein said calibration circuitry is configured to determine a difference between said first measured value and said second measured value of said output signal.

6. The circuit according to claim 1 wherein said feedback loop comprises a gain network, coupled to said at least one input and to said at least one output, and said gain network comprises at least one adjustable-impedance having selectable impedance values, wherein said calibration circuitry is configured to select an impedance value of the at least one adjustable-impedance.

7. The circuit according to claim 1 wherein the magnetic field sensor is an anisotropic magnetoresistive (AMR) magnetic sensor, the amplifier is configured to electrically couple to a bridge detection structure formed from a plurality of magnetoresistive elements of the magnetic field sensor, and said magnetic detection signal is an unbalancing signal of said bridge detection structure.

8. A system comprising:
a magnetic-field sensor configured to generate a magnetic field detection signal as a function of one or more magnetic fields; and
a reading circuit having:
an amplifier having at least one input coupled to the magnetic-field sensor and at least one output and configured to generate an output signal at the at least one output as a function of the magnetic field detection signal and of an amplification gain between the at least one input and the at least one output of the amplifier; and
calibration circuitry configured to generate one or more control signals to control a feedback loop of the amplifier based on an indication of a detection sensitivity of the magnetic field sensor.

9. The system of claim 8, comprising a controller, coupled to said reading circuit and configured to receive said output signal.

10. The system according to claim 8 wherein said reading circuit is an application-specific integrated circuit housed in a same package together with a die comprising said magnetic-field sensor.

11. The system of claim 8 wherein said calibration circuitry is configured to:
determine a value of the output signal associated with a controlled magnetic field having a known value;
generate an effective value of said detection sensitivity of the magnetic field sensor as a function of said determined value; and
generate the one or more control signals based on said effective value of said detection sensitivity.

12. The system of claim 11 wherein said calibration circuitry is configured to generate an excitation current to excite a magnetization element of the magnetic field sensor and the amplifier is configured to electrically couple to a first magnetoresistive element of the magnetic field sensor.

13. The system of claim 8 wherein said calibration circuitry is configured to:
measure at least a first value of said output signal, in the presence of an external magnetic field and in the absence of a controlled magnetic field;
measure at least a second value of said output signal, in the presence both of said external magnetic field and of said controlled magnetic field;
determine an effective value of said detection sensitivity of the magnetic field sensor as a function of said first and second measured values; and
generate the one or more control signals based on said effective value of said detection sensitivity.

14. The system of claim 13 wherein said calibration circuitry is configured to determine a difference between said first measured value and said second measured value of said output signal.

15. A method, comprising:
receiving, at an input of a reading circuit having an amplifier and calibration circuitry, a signal of a magnetic-field sensor, the received signal being a function of a detected magnetic field and of a detection sensitivity of the magnetic-field sensor;
generating, by the calibration circuitry, one or more signals to control a feedback loop of the amplifier to compensate for a variation of said detection sensitivity from a nominal detection sensitivity of the magnetic-field sensor; and
generating an output signal of the reading circuit as a function of said received signal and a gain of the amplifier.

16. The method of claim 15 wherein said generating the one or more signals to control the feedback loop comprises:
measuring a value of the output signal associated with a controlled magnetic field having a known value;
determining an effective value of said detection sensitivity of the magnetic-field sensor as a function of said measured value; and
generating the one or more signals to control the feedback loop based on said effective value of said detection sensitivity.

17. The method of claim 16 wherein said measuring a value of the output signal associated with a controlled magnetic field comprises generating an excitation current to excite a magnetization element of the magnetic field sensor.

18. The method of claim 15 wherein said generating the one or more control signals to control the feedback loop comprises:
measuring at least a first value of said output signal, in the presence of an external magnetic field and in the absence of a controlled magnetic field;
measuring at least a second value of said output signal, in the presence both of said external magnetic field and of said controlled magnetic field;
determining an effective value of said detection sensitivity of the magnetic-field sensor as a function of said first and second measured values; and
generating the one or more signals to control the feedback loop based on said effective value of said detection sensitivity.

19. The method of claim 18 wherein said determining said effective value comprises determining a difference between said first measured value and said second measured value of said output signal.

\* \* \* \* \*